(12) United States Patent
Smith et al.

(10) Patent No.: US 6,452,798 B1
(45) Date of Patent: Sep. 17, 2002

(54) ELECTRONIC MODULE INCLUDING A COOLING SUBSTRATE HAVING A FLUID COOLING CIRCUIT THEREIN AND RELATED METHODS

(75) Inventors: Brian Ronald Smith, Indialantic, FL (US); Raymond Charles Rumpf, Melbourne, FL (US); Charles Michael Newton, Palm Bay, FL (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 09/952,633

(22) Filed: Sep. 12, 2001

(51) Int. Cl.[7] .................................................. H05K 7/20
(52) U.S. Cl. ....................... 361/699; 361/700; 361/719; 257/714; 257/715; 174/15.1; 174/15.2; 165/80.4
(58) Field of Search ................................. 361/699, 700, 361/704, 710, 719, 720; 257/714, 715; 174/15.1, 15.2; 165/80.4

(56) References Cited

U.S. PATENT DOCUMENTS

| | | | |
|---|---|---|---|
| 4,519,447 A | * | 5/1985 | Wiech, Jr. ............... 165/104.23 |
| 4,727,454 A | * | 2/1988 | Neidig et al. ........... 165/104.33 |
| 5,168,919 A | * | 12/1992 | Berenholz et al. ..... 165/104.33 |
| 5,313,361 A | * | 5/1994 | Martin ....................... 165/80.3 |
| 5,870,823 A | | 2/1999 | Bezama et al. ................ 29/848 |
| 5,978,220 A | * | 11/1999 | Frey et al. .................. 165/80.4 |
| 6,365,260 B1 | * | 4/2002 | Stecher et al. ......... 165/104.26 |

FOREIGN PATENT DOCUMENTS

JP          358053854 A  *  3/1983  ................. 257/714

* cited by examiner

Primary Examiner—Boris Chervinsky
(74) Attorney, Agent, or Firm—Allen, Dyer, Doppelt, Milbrath & Gilchrist, P.A.

(57) ABSTRACT

A method for making an electronic module includes forming a cooling substrate having a fluid cooling circuit therein having a vertical passageway. The cooling substrate may be formed by forming a plurality of unsintered ceramic layers having passageways therein. The plurality of unsintered ceramic layers and at least one resistive element may be assembled in stacked relation so that the passageways align to define the fluid cooling circuit and so that the at least one resistive element extends in a cantilever fashion into the vertical passageway. Furthermore, the unsintered ceramic layers and the at least one resistive element may be heated to sinter and to cause the at least one resistive element to soften and deform downwardly adjacent vertical sidewall portions of the vertical passageway. The method may also include mounting at least one electronic device on the cooling substrate in thermal communication with the fluid cooling circuit.

23 Claims, 4 Drawing Sheets

ELECTRONIC MODULE INCLUDING A COOLING SUBSTRATE HAVING A FLUID COOLING CIRCUIT THEREIN AND RELATED METHODS

FIELD OF THE INVENTION

The present invention relates to the field of electronic modules, and, more particularly, to electronic modules including fluid cooling systems.

BACKGROUND OF THE INVENTION

Electronic devices are widely used in many types of electronic equipment. One electronic device is the integrated circuit which may include a silicon or gallium arsenide substrate and a number of active devices, such as transistors, etc. formed in an upper surface of the substrate. It is also typically required to support one or more such integrated circuits in a package that provides protection and permits external electrical connection.

As the density of active devices on typical integrated circuits has increased, dissipation of the heat generated has become increasingly more important. In particular, a relatively large amount of heat may be generated in multi-chip modules (MCMs), microwave transmitters, and photonic devices, for example.

A typical MCM may include a substrate upon which the electronic devices are mounted. Such substrates are generally made from a material that is suitable for withstanding the heat generated from the electronic devices. For example, ceramics such as low temperatures co-fired ceramics (LTCC) are commonly used for such substrates. Additionally, the MCM may also include a heat sink (e.g., fins) for dissipating heat from the electronic devices, and a fluid cooling circuit within the substrate for transferring heat between the electronic devices and the heat sink. That is, in two-phase cooling circuits, the heat from the electronic devices causes the cooling fluid to vaporize. Heat from the vapor is transferred to the heat sink, and the vapor then condenses to a liquid state. This liquid may then be re-circulated through the cooling circuit.

An example of such a substrate is disclosed in U.S. Pat. No. 5,870,823 to Bezama et al. entitled "Method of Forming a Multilayer Electronic Packaging Substrate with Internal Cooling Channels." The substrate includes a sintered ceramic body having cooling channels internal to and integral with the sintered ceramic body for the cooling a heat-generating electronic package placed on the sintered body. The flow of cooling fluid into and out of the cooling channels is controlled by manifolds and flow tubes connected to the substrate.

With the ever decreasing size of electronic devices and MCMs, it may be desirable to have fluid cooling circuits that do not require flow tubes, mechanical pumps, valves, etc., for circulating the cooling fluid therein. That is, such prior art devices may be relatively large and limit the ability to reduce the size of the substrate. In addition, such devices may be relatively expensive to produce.

SUMMARY OF THE INVENTION

In view of the foregoing background, it is therefore an object of the invention to provide an electronic module including a cooling substrate having a fluid cooling circuit therein for providing improved fluid flow control and associated methods.

This and other objects, features, and advantages in accordance with the present invention are provided by a method for making an electronic module including forming a cooling substrate having a fluid cooling circuit therein having a vertical passageway. The cooling substrate may be formed by forming a plurality of unsintered ceramic layers having passageways therein. The plurality of unsintered ceramic layers and the at least one resistive element may be assembled in stacked relation so that the passageways align to define the fluid cooling circuit and so that at least one resistive element extends in a cantilever fashion into the vertical passageway. Furthermore, the unsintered ceramic layers and the at least one resistive element may be heated to sinter and to cause the at least one resistive element to soften and deform downwardly adjacent vertical sidewall portions of the vertical passageway. The method may also include mounting at least one electronic device on the cooling substrate in thermal communication with the fluid cooling circuit.

More specifically, the at least one resistive element may be at least one layer of resistive ink.

Additionally, the at least one resistive element may include a plurality of resistive elements each between adjacent unsintered ceramic layers, and the plurality of resistive elements may be positioned adjacent opposing sidewalls of the vertical passageway.

The method may also include connecting the at least one resistive element to a voltage source for causing the at least one resistive element to heat and thereby facilitate fluid circulation in the cooling fluid circuit. The plurality of ceramic layers may be low temperature co-fired ceramic layers, for example. Also, a heat sink may be connected in thermal communication with the fluid cooling circuit.

An electronic module according to the invention includes a ceramic cooling substrate having a fluid cooling circuit therein having a vertical passageway defined by at least one vertical sidewall. The cooling substrate may include at least one resistive element on portions of the at least one vertical sidewall and extending into the at least one vertical sidewall a predetermined distance. Further, the electronic module may include at least one electronic device mounted on the cooling substrate and in thermal communication with the fluid cooling circuit.

More specifically, the at least one resistive element may include a plurality of resistive elements each extending into the at least one vertical sidewall the predetermined distance. For example, the predetermined distance may be greater than about 10 mils. Furthermore, the at least one vertical sidewall may include a plurality of sidewalls, and the plurality of resistive elements may be positioned adjacent at least two opposing vertical sidewalls of the vertical passageway. The ceramic substrate may include a low temperature co-fired ceramic, and the electronic module may further include a heat sink in thermal communication with the fluid cooling circuit.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and the dimensions of layers and regions may be exaggerated in the figures for greater clarity.

Figure 1:
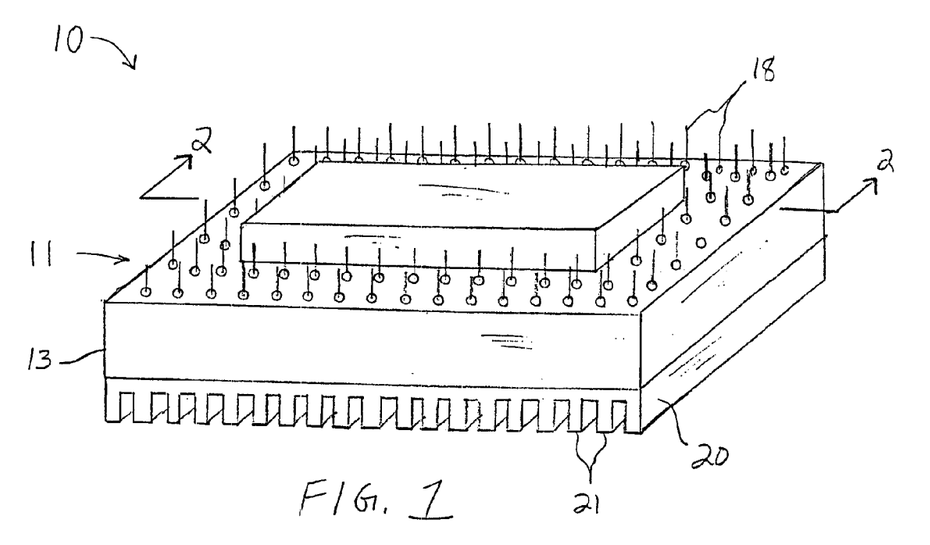
FIG. 1 is a perspective view of an electronic module including a cooling substrate according to the invention.
Figure 2:
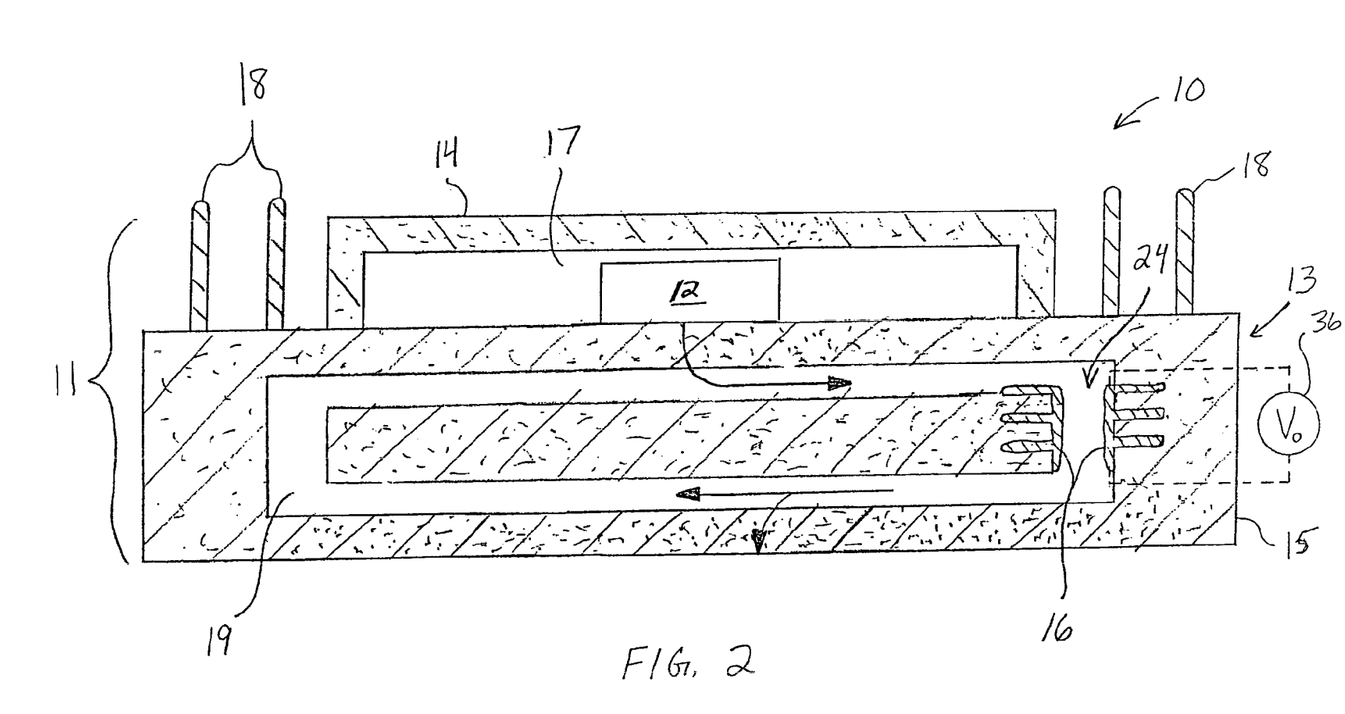
FIG. 2 is a cross-sectional view of the package of the electronic module of FIG. 1 taken along line 2—2.

Referring to FIGS. 1–2, an electronic module 10 in accordance with the invention is now initially described. The electronic module 10 includes a package 11 surrounding an electronic device 12. The package 11 includes a cooling substrate 13 and a lid 14 connected thereto. The cooling substrate 13 includes a base 15 and at least on resistive element 16, and it has a fluid cooling circuit 19 therein, as will be described further below. The lid 14 defines a cavity 17 over the electronic circuit 12 for protection of the electronic circuit and its interfaces (not shown).

The lid 14 may be attached by brazing using a seal ring, for example, as will be appreciated by those of skill in the art, though other configurations are also possible. The base 15 and lid 14 may include a low temperature co-fired ceramic (LTCC) material, for example. This material offers advantages in terms of ruggedness, and an ability to form recesses and small stable passageways therein, as well as to provide electrical paths therethrough. Of course, other similar materials may be used as well.

Furthermore, one or more electronic devices 12 may be carried by the package 11, as will be appreciated by those skilled in the art. The electronic device 12 may include semiconductor devices or integrated circuits, heat coils, resistors, etc., for example. Of course, other electronic devices may also be included in the electronic module 10. The package 11, as best seen in FIG. 1, may carry electrical connectors 18 on at least one of its surfaces. For example, the electrical connectors 18 may be pins in a pin grid array, as illustratively shown. In other embodiments, edge connectors may be provided to connect to a ribbon type cable, for example, as will be appreciated by those skilled in the art.

A heat sink 20 (FIG. 1) may be in thermal communication with the cooling substrate 13 and may include fins 21, for example. Of course, other heat sinks known to those of skill in the art may also be used. For example, the heat sink 20 maybe a rack or metal chassis in which the electronic module is mounted. Thus, heat will be transferred from the electronic device 12 to the fluid cooling circuit 19 through the base 15, and from the fluid cooling circuit to the heat sink 20 also through the base, as illustratively shown with arrows in FIG. 2. Furthermore, the cooling substrate 13 may optionally include vias or passageways (not shown) to provide enhanced thermal communication between the electronic device 12 and the fluid cooling circuit 19 and between the fluid cooling circuit and the heat sink 20 in some embodiments, as will be understood by those of skill in the art.

Figure 3:
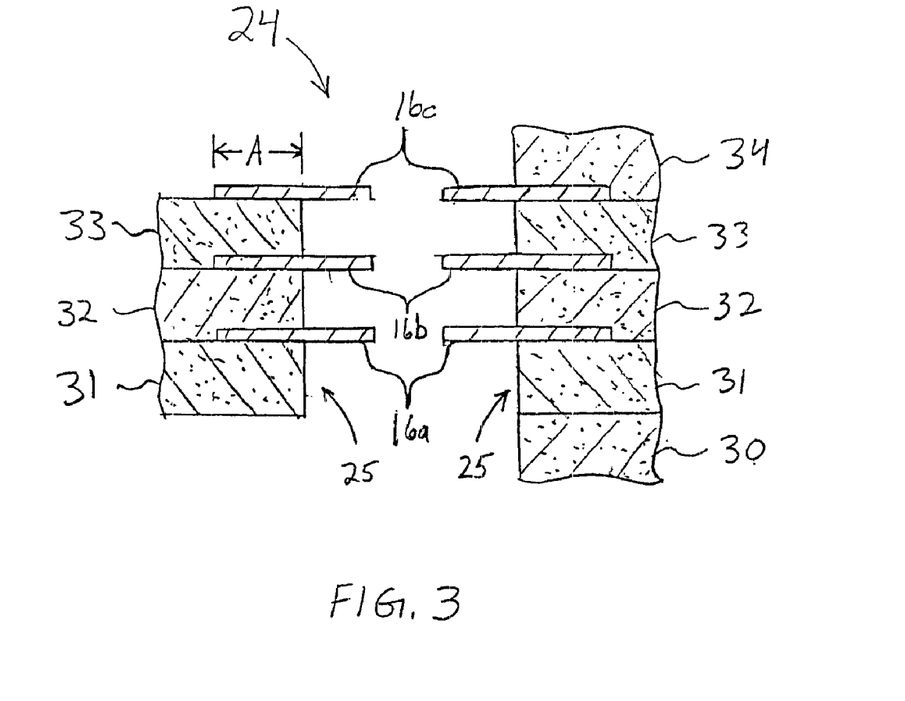
FIGS. 3–5 are cross-sectional views of the vertical passageway of the cooling substrate of FIG. 2 illustrating a method for making the electronic module of the present invention.
Figure 4:
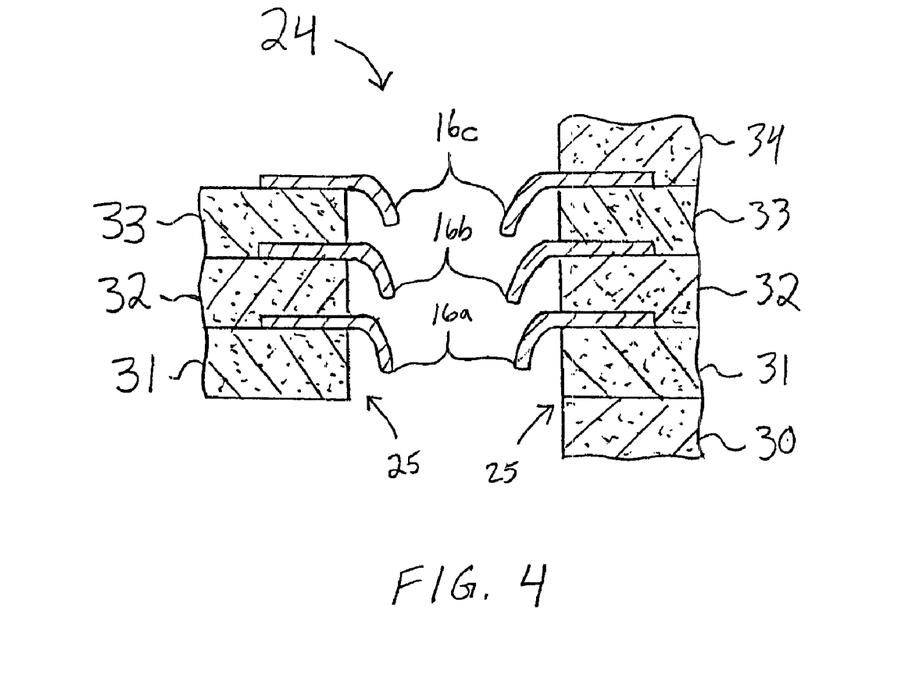
Figure 5:
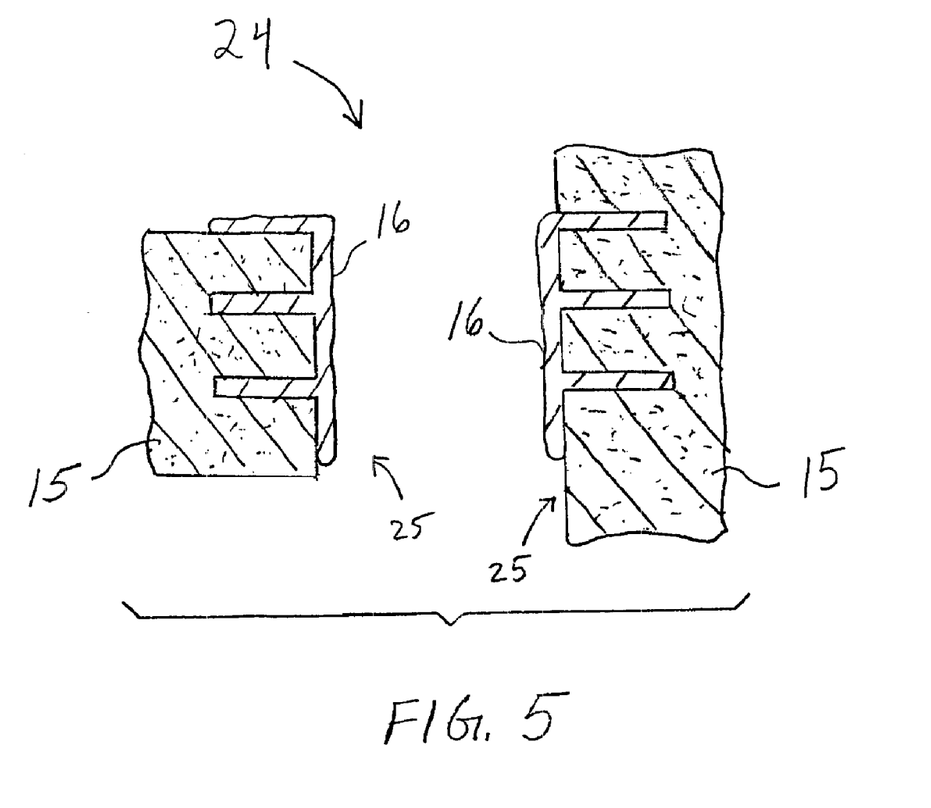

Turning now to FIGS. 3–5, the electronic module 20 will now be described in further detail with reference to a method for making the same. The method begins by forming the cooling substrate 13 so that it has the fluid cooling circuit 19 therein having the vertical passageway 24. More specifically, the cooling substrate 13 may be formed using a plurality of unsintered ceramic layers 30–34 having passageways therein. It should be noted here that only the unsintered ceramic layers 30–34 are shown in FIGS. 3–5 for clarity of illustration, but that additional unsintered ceramic layers may also be used in the fabrication the cooling substrate 13.

The plurality of unsintered ceramic layers 30–34 and resistive elements 16a–16c may be assembled in stacked relation so that the passageways align to define the fluid cooling circuit 19, and so that the resistive elements extend in a cantilever fashion into the vertical passageway 24, as seen in FIG. 3. More specifically, the resistive elements 16a–16c may be formed by applying one or more layers of resistive ink on respective unsintered ceramic layers 31–33. Of course, other suitable materials known to those of skill in the art are also contemplated by the invention, such as metal plates, etc.

After the unsintered ceramic layers 30–34 and the resistive elements 16a–16c are aligned, the cooling substrate 13 may be laminated using common laminating processes, for example, which causes the resistive elements 16a–16c to begin deforming toward respective vertical sidewalls 25 of the vertical passageway 24, as illustratively shown in FIG. 4. The lamination process will vary depending upon the amount of deformation desired and the materials used for the resistive elements 16a–16c, as will be appreciated by those of skill in the art. As noted above, varying materials other than resistive inks may be used for the resistive elements 16a–16c, some of which may not deform as readily as others.

The unsintered ceramic layers 30–34 and the resistive elements 16a–16c are heated to sinter and form the body 15 of the cooling substrate 13, as illustratively shown in FIG. 5. The heating also causes the resistive elements 16a–16c to soften and deform downwardly adjacent portions of the vertical sidewalls 25 and thus form the resistive elements 16. The heating may be performed according to typical LTCC process parameters, which will be appreciated by those of skill in the art.

It will also be appreciated by those of skill in the art that different geometries may be used for the vertical passageway 24. That is, if the vertical passageway 24 is generally circular, then there will be only a single vertical sidewall 25. Of course, if the vertical passageway 24 is generally rectangular, then there will be opposing pairs of vertical sidewalls 25. As shown in FIGS. 3–5, the resistive elements 16a–16c are positioned between adjacent ceramic layers 31, 32; 32, 33; and 33, 34, respectively, and also positioned adjacent opposing sidewalls 25 of the vertical passageway 24. The resistive elements 16a–16c preferably extend into the vertical sidewalls 25 a predetermined distance A, which is preferably greater than about 10 mils, for example.

The resistive elements 16a–16c may be connected to a voltage source 36 for causing the resistive elements 16 to heat and, in conjunction with other geometric and topological features of the cooling fluid circuit 19, thereby facilitate fluid circulation in the cooling fluid circuit 19, as will be readily appreciated by those of skill in the art. For example, the voltage source 36 may be external to the electronic module 10, or the electronic device 12 may provide the voltage to the resistive elements 16. By way of example, vias filled with a conductive ink may be used for connecting the voltage source 36 with the resistive elements 16. Of course, a termination ink layer may be required for such connections, and other suitable connections may also be used, as will be appreciated by those of skill in the art.

More specifically, heating the resistive elements 16 may vaporize fluid adjacent thereto to define a vapor region of flow in the two-phase fluid cooling circuit 19. This is particularly advantageous when the electronic module 10 is "cold," i.e., when most of the fluid is in a liquid state. The resistive elements 16 may be used to establish the two-phase fluid flow before the electronic device 12 begins operation, which may not otherwise be possible using heat solely from the electronic device. Of course, those of skill in the art will appreciate that the resistive elements 16 may also be used in a single phase fluid circuit as well.

Accordingly, it will be appreciated by those of skill in the art that the cooling substrate 13 of the present invention provides relatively small and inexpensive embedded resistive elements 16 that are controllable and reliable. Further, thermally efficient, localized (e.g., within about 100 μm or less), and relatively precise fluid flow control may be achieved without the need for prior art control devices, such as methanical pumps and valves. Also, the electronic module 10 according to the present invention may advantageously be fabricated using current materials and processes known to those of skill in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making an electronic module comprising:
    forming a cooling substrate having a fluid cooling circuit therein having a vertical passageway by
        forming a plurality of unsintered ceramic layers having passageways therein,
        assembling the plurality of unsintered ceramic layers and at least one resistive element in stacked relation so that the passageways align to define the fluid cooling circuit and so that the at least one resistive element extends in a cantilever fashion into the vertical passageway, and
        heating to sinter the unsintered ceramic layers and the at least one resistive element and to cause the at least one resistive element to soften and deform downwardly adjacent vertical sidewall portions of the vertical passageway; and
    mounting at least one electronic device on the cooling substrate in thermal communication with the fluid cooling circuit.

2. The method of claim 1 wherein the at least one resistive element comprises at least one layer of resistive ink.

3. The method of claim 1 wherein the at least one resistive element comprises a plurality of resistive elements each between adjacent ceramic layers.

4. The method of claim 3 wherein the plurality of resistive elements are positioned adjacent opposing sidewalls of the vertical passageway.

5. The method of claim 1 further comprising connecting the at least one resistive element to a voltage source for causing the at least one resistive element to heat and thereby facilitate fluid circulation in the cooling fluid circuit.

6. The method of claim 1 wherein the plurality of ceramic layers comprise low temperature co-fired ceramic layers.

7. The method of claim 1 further comprising connecting a heat sink in thermal communication with the fluid cooling circuit.

8. A method for making an electronic module comprising:
    forming a cooling substrate having a fluid cooling circuit therein having a vertical passageway by
        forming a plurality of unsintered low-temperature co-fired ceramic layers having passageways therein,
        assembling the plurality of unsintered ceramic layers and a plurality of resistive elements in stacked relation so that the passageways align to define the fluid cooling circuit and so that each of the plurality of resistive elements is between adjacent ceramic layers and extends in a cantilever fashion into the vertical passageway, and
        heating to sinter the unsintered ceramic layers and the plurality of resistive elements and to cause the plurality of resistive elements to soften and deform downwardly adjacent vertical sidewall portions of the vertical passageway; and
    mounting at least one electronic device on the cooling substrate in thermal communication with the fluid cooling circuit.

9. The method of claim 8 wherein each of the plurality of resistive elements comprises at least one layer of resistive ink.

10. The method of claim 8 wherein the plurality of resistive elements are positioned adjacent opposing sidewalls of the vertical passageway.

11. The method of claim 8 further comprising connecting the plurality of resistive elements to a voltage source for causing the plurality of resistive elements to heat and thereby facilitate fluid circulation in the cooling fluid circuit.

12. The method of claim 8 further comprising connecting a heat sink in thermal communication with the fluid cooling circuit.

13. An electronic module comprising:
    a ceramic cooling substrate having a fluid cooling circuit therein having a vertical passageway defined by at least one vertical sidewall, the cooling substrate comprising at least one resistive element on portions of the at least one vertical sidewall and extending into the at least one vertical sidewall a predetermined distance; and
    at least one electronic device mounted on the cooling substrate and in thermal communication with the fluid cooling circuit.

14. The electronic module of claim 13 wherein the at least one resistive element comprises a plurality of resistive elements each extending into the at least one vertical sidewall the predetermined distance.

15. The electronic module of claim 14 wherein the at least one vertical sidewall comprises a plurality of sidewalls; and wherein said plurality of resistive elements are positioned adjacent at least two opposing vertical sidewalls of the vertical passageway.

16. The electronic module of claim 13 wherein said ceramic cooling substrate comprises a low temperature co-fired ceramic.

17. The electronic module claim 13 further comprising a heat sink in thermal communication with the fluid cooling circuit.

18. The electronic module of claim 13 wherein the predetermined distance is greater than about 10 mils.

19. A cooling substrate comprising:
    a ceramic body having a fluid cooling circuit therein having a vertical passageway defined by at least one vertical sidewall; and
    at least one resistive element on portions of the at least one vertical sidewall and extending into the at least one vertical sidewall a predetermined distance.

20. The electronic module of claim 19 wherein the at least one resistive element comprises a plurality of resistive elements each extending into the at least one vertical sidewall the predetermined distance.

21. The electronic module of claim 20 wherein the at least one vertical sidewall comprises a plurality of sidewalls; and wherein said plurality of resistive elements are positioned adjacent at least two opposing vertical sidewalls of the vertical passageway.

22. The electronic module of claim 19 wherein said ceramic body comprises a low temperature co-fired ceramic.

23. The electronic module of claim 20 wherein the predetermined distance is greater than about 10 mils.

* * * * *

UNITED STATES PATENT AND TRADEMARK OFFICE
CERTIFICATE OF CORRECTION

PATENT NO.      : 6,452,798 B1
DATED           : September 17, 2002
INVENTOR(S)     : Brian Ronald Smith, Raymond Charles Rumpf and Charles Michael Newton It is certified that error appears in the above-identified patent and that said Letters Patent is hereby corrected as shown below:

The title page should be deleted and substitute therefor the attached title page, <u>Drawings,</u>
Delete Figures 1, 2, 3, 4 and 5, and substitute therefor Figures 1, 2, 3, 4 and 5, as shown on the attached pages.

<u>Column 1,</u>
Line 45, delete "for the cooling" insert -- for cooling --

<u>Column 3,</u>
Line 13, delete "on" insert -- one --
Line 41, delete "maybe" insert -- may be --
Line 62, delete "fabrication the" insert -- fabrication of the --

<u>Column 5,</u>
Line 5, delete "methanical" insert -- mechanical --

<u>Column 6,</u>
Line 41, delete "module claim" insert -- module of claim --

Signed and Sealed this

Sixth Day of May, 2003

JAMES E. ROGAN
*Director of the United States Patent and Trademark Office*

(12) United States Patent
Smith et al.

(10) Patent No.: US 6,452,798 B1
(45) Date of Patent: Sep. 17, 2002

(54) ELECTRONIC MODULE INCLUDING A COOLING SUBSTRATE HAVING A FLUID COOLING CIRCUIT THEREIN AND RELATED METHODS

(75) Inventors: Brian Ronald Smith, Indialantic, FL (US); Raymond Charles Rumpf, Melbourne, FL (US); Charles Michael Newton, Palm Bay, FL (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 09/952,633

(22) Filed: Sep. 12, 2001

(51) Int. Cl.$^7$ ................................................. H05K 7/20
(52) U.S. Cl. .................... 361/699; 361/700; 361/719; 257/714; 257/715; 174/15.1; 174/15.2; 165/80.4
(58) Field of Search .................. 361/699, 700, 361/704, 710, 719, 720; 257/714, 715; 174/15.1, 15.2; 165/80.4

(56) References Cited

U.S. PATENT DOCUMENTS

| | | | |
|---|---|---|---|
| 4,519,447 A | * | 5/1985 | Wiech, Jr. ............... 165/104.23 |
| 4,727,454 A | * | 2/1988 | Neidig et al. ........... 165/104.33 |
| 5,168,919 A | * | 12/1992 | Berenholz et al. ...... 165/104.33 |
| 5,313,361 A | * | 5/1994 | Martin ....................... 165/80.3 |
| 5,870,823 A | | 2/1999 | Bezama et al. ............... 29/848 |
| 5,978,220 A | * | 11/1999 | Frey et al. ................. 165/80.4 |
| 6,365,260 B1 | * | 4/2002 | Stecher et al. .......... 165/104.26 |

FOREIGN PATENT DOCUMENTS

JP 358053854 A * 3/1983 ................. 257/714

* cited by examiner

*Primary Examiner*—Boris Chervinsky
(74) *Attorney, Agent, or Firm*—Allen, Dyer, Doppelt, Milbrath & Gilchrist, P.A.

(57) ABSTRACT

A method for making an electronic module includes forming a cooling substrate having a fluid cooling circuit therein having a vertical passageway. The cooling substrate may be formed by forming a plurality of unsintered ceramic layers having passageways therein. The plurality of unsintered ceramic layers and at least one resistive element may be assembled in stacked relation so that the passageways align to define the fluid cooling circuit and so that the at least one resistive element extends in a cantilever fashion into the vertical passageway. Furthermore, the unsintered ceramic layers and the at least one resistive element may be heated to sinter and to cause the at least one resistive element to soften and deform downwardly adjacent vertical sidewall portions of the vertical passageway. The method may also include mounting at least one electronic device on the cooling substrate in thermal communication with the fluid cooling circuit.

23 Claims, 4 Drawing Sheets